United States Patent [19]
Akiyama

[11] Patent Number: 6,009,028
[45] Date of Patent: Dec. 28, 1999

[54] FAILURE SELF-DIAGNOSIS DEVICE FOR SEMICONDUCTOR MEMORY

[75] Inventor: Tsutomu Akiyama, Tokyo, Japan

[73] Assignee: Ando Electric Co., Ltd., Tokyo, Japan

[21] Appl. No.: 09/154,774

[22] Filed: Sep. 17, 1998

[30] Foreign Application Priority Data

Sep. 30, 1997 [JP] Japan .................................. 9-266364

[51] Int. Cl.⁶ .................................................. G11C 7/00
[52] U.S. Cl. .................. 365/201; 365/189.07; 371/22.5; 371/25.1
[58] Field of Search .................................... 365/201, 233, 365/189.07, 236, 233.5; 371/22.5, 25.1, 27.1

[56] References Cited

U.S. PATENT DOCUMENTS

| | | | |
|---|---|---|---|
| 5,271,015 | 12/1993 | Akiyama | 371/21.5 |
| 5,856,985 | 1/1999 | Fujisaki | 371/27.1 |
| 5,859,804 | 1/1999 | Hedberg et al. | 365/201 |
| 5,862,151 | 1/1999 | Fagerness | 371/22.5 |
| 5,864,565 | 1/1999 | Ochoa et al. | 371/24 |

*Primary Examiner*—David Nelms
*Assistant Examiner*—Hien Nguyen
*Attorney, Agent, or Firm*—Pillsbury Madison & Sutro, LLP

[57] ABSTRACT

The failure self-diagnosis device for semiconductor memory, comprises: a CPU for controlling a diagnosis operation; a data generating circuit for generating a test data to be written into memory elements to be diagnosed and an expected data which is the same as a data to be precisely read out from the memory elements after the test data was precisely written into the memory elements; a clock generating circuit for outputting a clock signal; address generating circuits, each of which is arranged with each of the memory elements to be diagnosed, for generating address assigning signals by synchronizing with the clock signal; comparators, each of which is arranged with each of the memory elements to be diagnosed, for comparing read out data which was read out from each of the memory elements by synchronizing with the address assigning signal, with the expected data; and diagnosis stop circuits, each of which is arranged with each of the memory elements to be diagnosed, for stopping the diagnosis operation of each of the memory elements when a corresponding comparator judges that the read out data from a corresponding memory element is not coincident with the expected data.

5 Claims, 5 Drawing Sheets

FAILURE SELF-DIAGNOSIS DEVICE FOR SEMICONDUCTOR MEMORY

BACKGROUND OF THE INVENTION

1. Field of the Invention

The present invention relates to a failure self-diagnosis device for semiconductor memory, in particular, a failure self-diagnosis device for semiconductor memory, which is used for an IC tester on which a multi-bit semiconductor memory having a large capacity is mounted.

2. Description of the Related Art

FIG. 5 is a construction view showing a typical conventional failure self-diagnosis device for semiconductor memory, for example, which is disclosed in U.S. Pat. No. 5,271,015 corresponding to Japanese Patent Application No. Tokukai-Hei 4-178580. As shown in FIG. 5, the device comprises: (a) a CPU 51 into which a sequence program for a diagnosis is written; (b) a clock generating circuit 56 which is started by a test start signal TST of the CPU 51; (c) a data generating circuit 52 which is operated by an output CLKa of the clock generating circuit 56, for generating data to be written by a memory 55 when the CPU 51 sets a memory writing mode (a signal WMD is "H"), and for generating expected data when the CPU 51 sets a memory reading out mode (a signal WMD is "L"); (d) an address generating circuit 53 which is operated by an output CLKa of the clock generating circuit 56, for generating an address assigning signal to write the data generated by the data generating circuit 52 into a predetermined address of the memory 55 when the CPU 51 sets a memory writing mode, and for generating an address assigning signal to read out data from the predetermined address of the memory 55 when the CPU 51 sets a memory read out mode; (e) a test finish detecting circuit 57 which is operated by the output CLKa of the clock generating circuit 56, for detecting that a test of the memory 55 is finished, and for generating a test stop signal TSP to stop an operation of the clock generating circuit 56; (f) a switching circuit 58 for inputting the data generated by the data generating circuit 52, for outputting an input data as an input data MID of the memory 55 when the CPU 51 sets the memory writing mode, and for outputting an input data as an expected data EXD when the CPU 51 sets the memory reading out mode; (g) a comparator 54 for inputting a read out data MOD of the memory 55 as a first input and an expected data EXD of the memory 55 as a second input, to compare the read out data MOD of the memory 55 with the expected data EXD, and for detecting coincidence or non-coincidence between the expected data EXD and the read out data MOD to judge whether the memory 55 is normal or failed; and (h) a flip flop (hereinafter, referred as to "FF") 59 which inputs an output CMP of the comparator 54 as a set signal and the test signal TST of the CPU 51 as a reset signal, for outputting a failure signal when the set signal is inputted.

When the CPU 51 sets the memory writing mode (the signal WMD is "H"), a write enable signal MWT to be outputted to the memory 55 is generated by a NAND circuit 60 by synchronizing with the output CLKb (having a phase which is different from that of the signal CLKa) of the clock generating circuit 56.

In the above-described device, the self-diagnosis of the memory 55 is carried out as follows.

The CPU 51 sets the writing mode (the signal WMD is "H"). The CPU 51 sets initial data values for the data generating circuit 52 through a data bus DTB, and sets initial address value for the address generating circuit 53 therethrough. Further, the CPU 51 sets a test finish condition for the test finish detecting circuit 57. Sequentially, the CPU 51 outputs the test start signal TST to the clock generating circuit 56 in order to start it.

The clock generating circuit 56 generates the clock signals CLKa and CLKb having phases which are different from each other. The data generating circuit 52, the address generating circuit 53 and the NAND circuit 60 are operated by synchronizing with the clock signals CLKa and CLKb in order to write the data generated by the data generating circuit 52 into the address of the memory 55, which is assigned by the address assigning signal generated by the address generating circuit 53.

When the memory writing operation in which the data was written into an address region to be tested was finished, the test finish detecting circuit 57 detects the finish of the memory writing operation and generates the test finish signal TSP to stop the clock generating circuit 56.

Next, the CPU 51 sets the reading out mode (the signal WMD is "L"). Similarly to the writing mode, the CPU 51 sets initial data values for the data generating circuit 52 through the data bus DTB, and sets initial address value for the address generating circuit 53 therethrough. Further, the CPU 51 sets the test finish condition for the test finish circuit 57. Sequentially, the CPU 51 outputs the test start signal TST to the clock generating circuit 56 in order to start it, and outputs the signal TST to the FF 59 in order to reset it.

The clock generating circuit 56 generates the clock signals CLKa and CLKb having phases which are different from each other. The data generating circuit 52 and the address generating circuit 53 are operated by synchronizing with the clock signal CLKa in order to read out the data from the address of the memory 55, which is assigned by the address assigning signal generated by the address generating circuit 53 and in order to read out the expected data EXD generated by the data generating circuit 52. The comparator 54 compares the expected data EXD with the data MOD which is read out from the memory 55 in sequence. As a result that the comparator 54 compares two data, when two data are not coincident with each other and the comparator 54 detects the failure of the memory 55, the FF 59 is set by the comparison result signal CMP.

When the data read out operation in which the data is read out from the address region to be tested, of the memory 55 and the comparing operation in which the comparator 54 compares the expected data EXD with the data MOD, are finished, or when the comparator 54 detects the failure of the memory 55, the test finish detecting circuit 57 detects the finish of the data readout operation and the comparing operation. Then, the test finish detecting circuit 57 generates the test stop signal TSP to stop the clock generating circuit 56 and the test is finished.

The diagnosis of the memory 55 can be carried out by examining the output of the FF 59 through a tester pin when the test is finished.

However, because the conventional self-diagnosis device for semiconductor memory has the above-described construction, there are the following problems. In the self-diagnosis of the memory, when the failure does not occur, the self-diagnosis can be carried out at high speed. On the other hand, when the failure occurs at a plurality of addresses, so that the set signals are outputted to a plurality of tester pins, it is necessary to test the memory the same number of times that the self-diagnosis device detects the failures, in order to search the tester pin corresponding to the failed address and the address at which the failure occurs. As a result, it takes a long time to test the memory.

SUMMARY OF THE INVENTION

The present invention was developed in view of these problems.

An object of the present invention is to provide a failure self-diagnosis device for semiconductor memory which can test and examine the memory at high speed even when the various failures occur.

In order to accomplish the above-described object, a failure self-diagnosis device for semiconductor memory has a construction in which some types of resources which must be provided in accordance with the number of memory elements corresponding to the number of tester pins and must be arranged with each of the memories, are incorporated into the other types of resources which can be arranged as a common unit of all the memories.

That is, in accordance with one aspect of the present invention, the failure self-diagnosis device for semiconductor memory, comprises: a CPU into which a sequence program for a diagnosis is written, for controlling a diagnosis operation; a data generating circuit for generating a test data to be written into all of memory elements when the CPU sets a memory writing mode, and for generating an expected data which is the same as a data to be precisely read out from all of the memory elements when the CPU sets a memory reading out mode; a clock generating circuit which is started by a test start signal of the CPU, for outputting a plurality of clock signals; a first test finish detecting unit for detecting that a test of the memory elements is finished in a predetermined region of the memory elements, and for generating a first test stop signal to stop an operation of the clock generating circuit; address generating circuits, each of which is arranged with each of the memory elements, for generating address assigning signals to write the test data into predetermined addresses of the memory elements when the CPU sets the memory writing mode, and for generating address assigning signals to read out stored data which is written into each of the memory elements in the memory writing mode, from the predetermined addresses of the memory elements when the CPU sets the memory reading out mode; comparators, each of which is arranged with each of the memory elements, for comparing read out data which was read out from each of the memory elements with the expected data which was outputted from the data generating circuit to generate comparison result signals; flip flop circuits, each of which is arranged with each of the memory elements and is reset by the test start signal, and each of which is set to inactivate a corresponding address generating circuit when receiving the comparison result signal representing that the read out data from a corresponding memory element is not coincident with the expected data from the data generating circuit; a write enable circuit for generating a write enable signal to be outputted to the memory elements, by synchronizing with a first clock signal outputted from the clock generating circuit when the CPU sets the memory writing mode; and a comparator activating circuit for generating a comparator activating signal which activates the comparators, by synchronizing with a second clock signal outputted from the clock generating circuit when the CPU sets the memory reading out mode.

According to the present invention, each of the address generating circuits, each of the comparators and each of the flip flop circuits are arranged with each of memory elements to be diagnosed. When a failure of a certain memory element is detected as a result of a diagnosis and a flip flop circuit corresponding to the memory element is set, an address generating circuit corresponding to the memory element is inactivated in order to finish the test of the memory element. On the other hand, the other memory elements of which the failure is not detected, continues to be diagnosed.

As a result, the failed memory element can be detected by examining the output of each of flip flop circuits through each of the tester pins when the test was finished. Further, the address at which the failure occurs is detected by examining the address generating circuit corresponding to the failed memory element.

Each of the address generating circuits may comprise an up counter. The test finish detecting unit may comprise a down counter.

The failure self-diagnosis device for semiconductor memory may further comprise a second test finish detecting unit for generating a second test stop signal to stop the operation of the clock generating circuit when the second test finish detecting unit inputs output signals of all of the flip flop circuits and all of the flip flop circuits are set.

In the case that the failures are detected in all of the memory elements before the test is finished in the predetermined address region, the operation of the clock generating circuit is immediately stopped. Because the test is finished without operating the clock generating circuit during unnecessary period (from the time that the failures are detected in all of the memory elements till the time that the test is finished in the predetermined address region), the failure self-diagnosis device can carry out an diagnosis efficiently.

In accordance with another aspect of the present invention, the failure self-diagnosis device for semiconductor memory, comprises: a CPU for controlling a diagnosis operation; a data generating circuit for generating a test data to be written into memory elements to be diagnosed and an expected data which is the same as a data to be precisely read out from the memory elements after the test data was precisely written into the memory elements; a clock generating circuit for outputting a clock signal; address generating circuits, each of which is arranged with each of the memory elements to be diagnosed, for generating address assigning signals by synchronizing with the clock signal; comparators, each of which is arranged with each of the memory elements to be diagnosed, for comparing read out data which was read out from each of the memory elements by synchronizing with the address assigning signal, with the expected data; and diagnosis stop circuits, each of which is arranged with each of the memory elements to be diagnosed, for stopping the diagnosis operation of each of the memory elements when a corresponding comparator judges that the read out data from a corresponding memory element is not coincident with the expected data.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Figure 1:
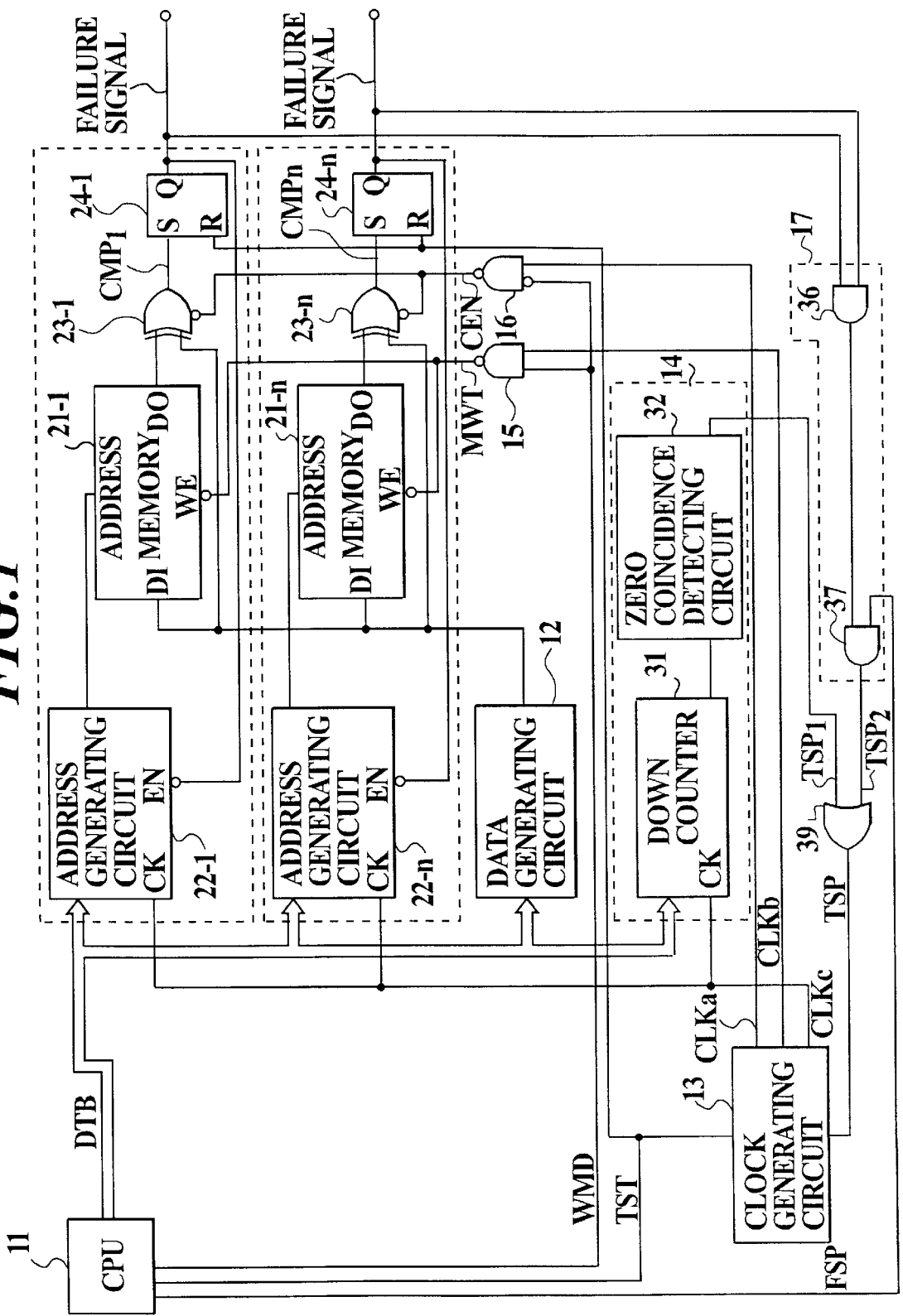
FIG. 1 is a view showing a construction of an embodiment of the failure self-diagnosis device for semiconductor memory according to the present invention.

Hereinafter, an embodiment of the failure self-diagnosis device for semiconductor memory according to the present invention will be explained with reference to the attached drawings. In these drawings, the same elements have the same reference numerals, and the repeated explanation for them will be omitted.

FIG. 1 shows a view showing a construction of an embodiment of the failure self-diagnosis device for semiconductor memory according to the present invention. As shown in FIG. 1, the device comprises: (a) a CPU 11 into which a sequence program for a diagnosis is written, for controlling a diagnosis operation; (b) a data generating circuit 12 for generating a test data to be written into all of memory elements 21-1 to 21-n when the CPU 11 sets a memory writing mode (a signal WHD is "H"), and for generating an expected data which is the same as a data to be precisely read out from all of the memory elements 21-1 to 21-n when the CPU 11 sets a memory reading out mode (a signal WHD is "L"); (c) a clock generating circuit 13 which is started by a test start signal TST of the CPU 11, for outputting clock signals CLKa, CLKb and CLKc; (d) a first test finish detecting unit 14 for detecting that a test of the memory elements 21-1 to 21-n is finished in a predetermined region of the memory elements 21-1 to 21-n, and for generating a first test stop signal TSP1 to stop an operation of the clock generating circuit 13; (e) address generating circuits 22-1 to 22-n, each of which is arranged with each of the memory elements 21-1 to 21-n, for generating address assigning signals to write the test data generated by the data generating circuit 12 into predetermined addresses of the memory elements 21-1 to 21-n when the CPU 11 sets the memory writing mode, and for generating address assigning signals to read out stored data which is written into each of the memory elements in the memory writing mode from the predetermined addresses of the memory elements 21-1 to 21-n when the CPU 11 sets the memory reading out mode; (f) comparators 23-1 to 23-n, each of which is arranged with each of the memory elements 21-1 to 21-n, for comparing read out data which was read out from each of the memory elements 21-1 to 21-n with the expected data which was outputted from the data generating circuit 12 to generate comparison result signals; (g) flip flop circuits (hereinafter, referred as to "FF") 24-1 to 24-n, each of which is arranged with each of the memory elements 21-1 to 21-n and is reset by the test start signal TST, and each of which is set to inactivate a corresponding address generating circuit 22-1 to 22-n when receiving the comparison result signal CMP1 to CMPn representing that the read out data from a corresponding memory element 21-1 to 21-n is not coincident with the expected data from the data generating circuit 12; (h) a write enable circuit 15 for generating a write enable signal MWT to be outputted to the memory elements 21-1 to 21-n, by synchronizing with the clock signal CLKb outputted from the clock generating circuit 13 when the CPU 11 sets the memory writing mode; (i) a comparator activating circuit 16 for generating a comparison enable signal CEN which activates the comparators 23-1 to 23-n, by synchronizing with the clock signal CLKa outputted from the clock generating circuit 13 when the CPU 11 sets the memory reading out mode; and (j) a second test finish detecting unit 17 for generating a second test stop signal TSP2 which stops the operation of the clock generating circuit 13 when the second test finish detecting unit inputs output signals of all of the FFs 24-1 to 24-n and all of the FFs 24-1 to 24-n are set.

Each of the address generating circuits 22-1 to 22-n comprises an up counter which can read and write a current value outputted from the CPU 11, for counting up by synchronizing with the clock signal CLKc.

The first test finish detecting unit 14 comprises a down counter 31 which can write a current value outputted from the CPU 11, for counting down by synchronizing with the clock signal CLKc; and a zero coincident detecting circuit 32 for generating the first test stop signal TSP1 when the current value outputted from the down counter 31 is "0".

The second test finish detecting unit 17 comprises a first AND circuit 36 for carrying out an AND operation of the outputs of all of the FFs 24-1 to 24-n to output a result of the AND operation to the clock generating circuit 13; a second AND circuit 37 for carrying out an AND operation of the output signal of the AND circuit 36 and a failure stop mode signal FSP outputted from the CPU 11 to output the second test stop signal TSP2 to an OR circuit 39.

The OR circuit 39 carries out an OR operation of the first test stop signal TSP1 and the second test stop signal TSP2 to output the clock stop signal TSP to the clock generating circuit 13.

Figure 2:
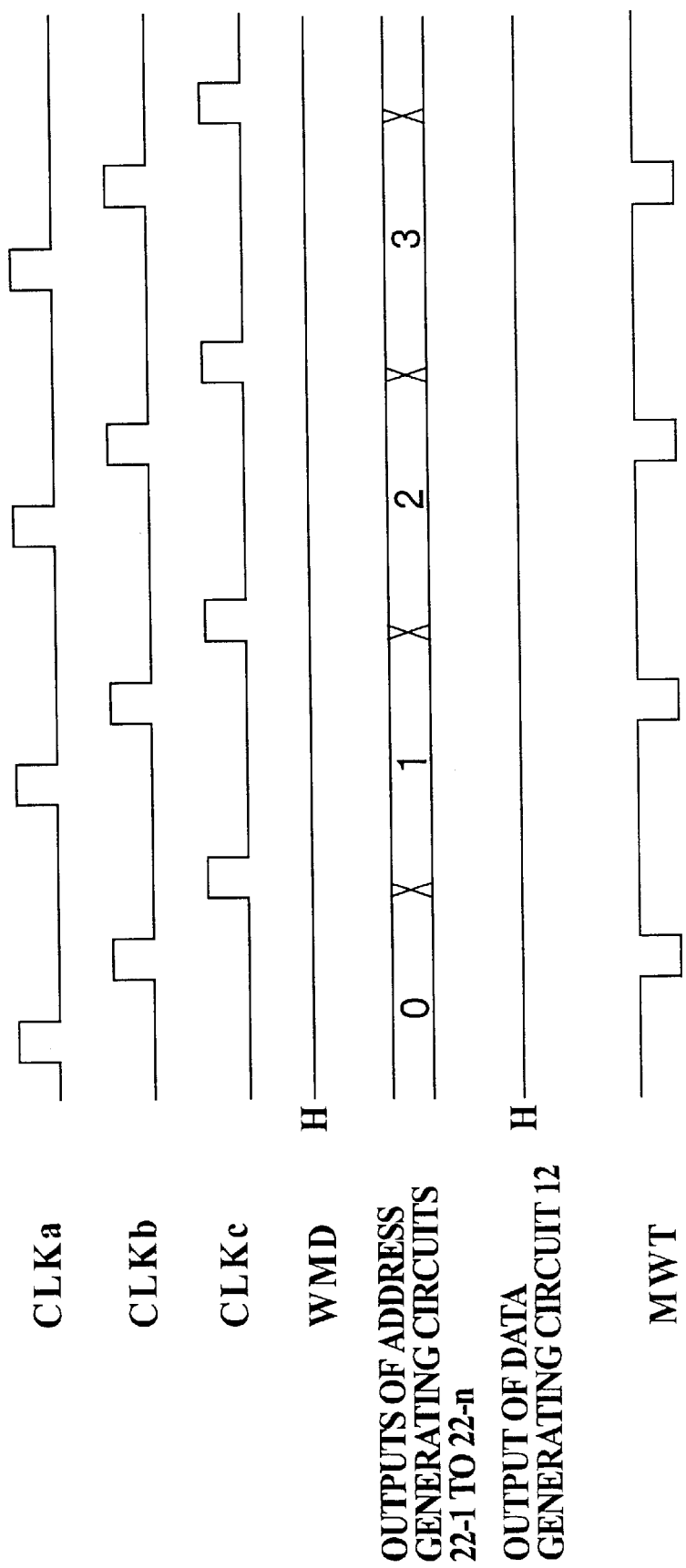
FIG. 2 is a time chart for explaining the operation in which the data are written into the memory elements in the device shown in FIG. 1.
Figure 3:
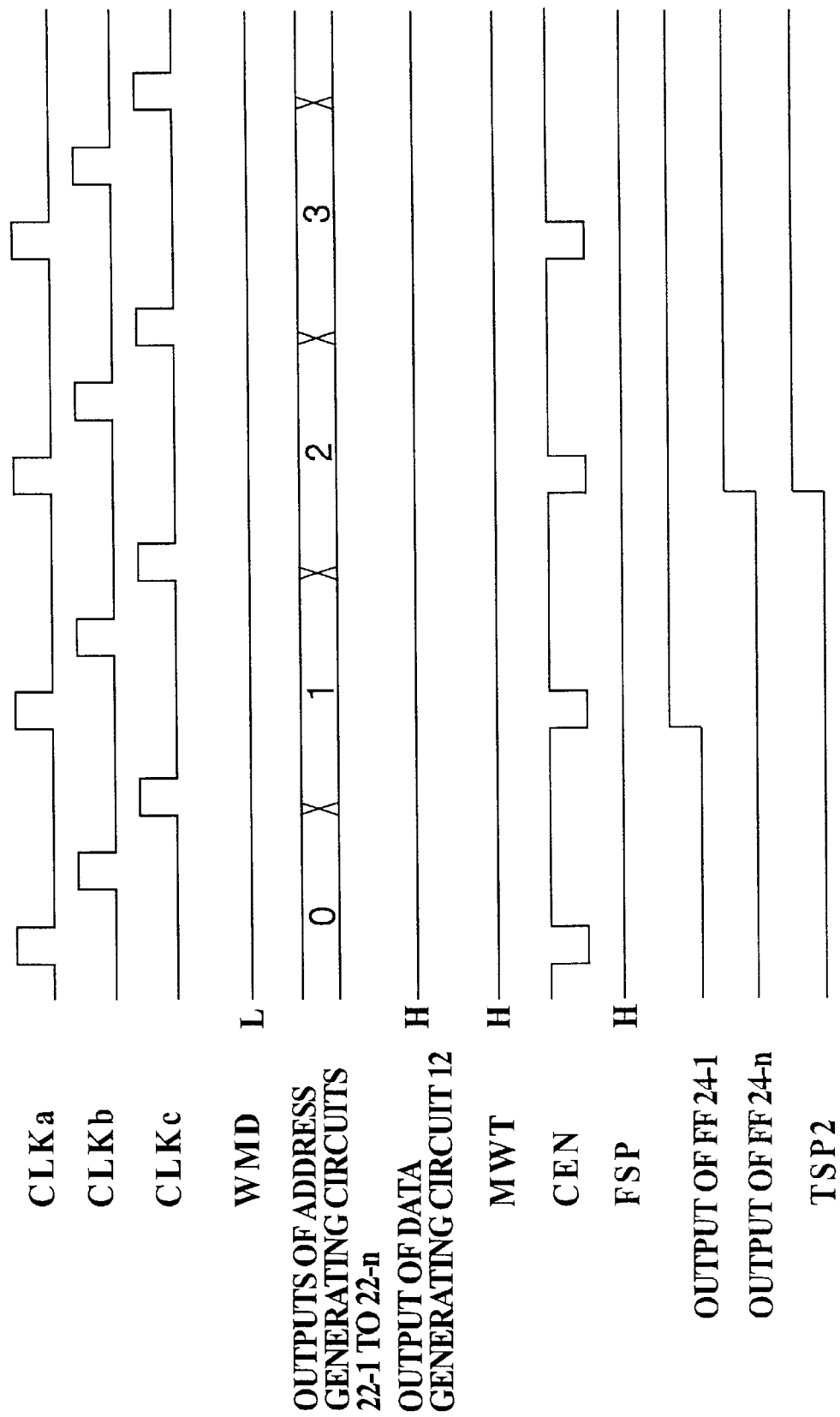
FIG. 3 is a time chart for explaining the operation in which the data are read out from the memory elements in the device shown in FIG. 1.

The operation of the device according to the present invention will be explained below. FIG. 2 is a time chart for explaining the operation in which the data are written into the memory elements 21-1 to 21-n, and FIG. 3 is a time chart for explaining the operation in which the data are read out from the memory elements 21-1 to 21-n.

First, the operation in which the predetermined data are written into the memory elements 21-1 to 21-n will be explained below.

Before the data are written into the memory elements 21-1 to 21-n, the CPU 11 sets a start address of the address region to be tested by writing the current value into the up counters of the address generating circuits 22-1 to 22-n through the data bus DTB, and sets a size of the address region to be tested by writing the current value into the down counter 31 of the first test finish detecting unit 14.

Figure 4:
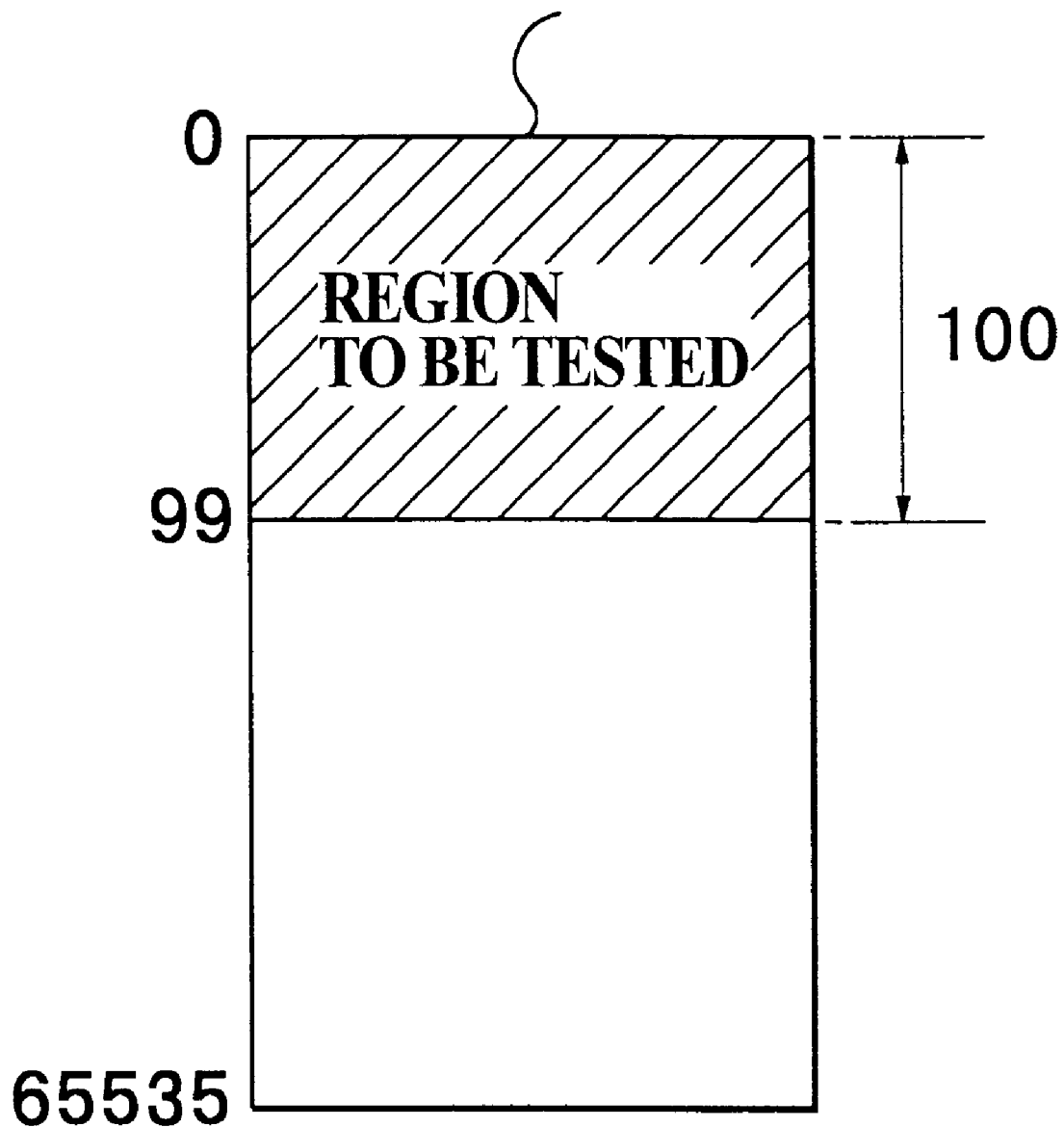
FIG. 4 is a view for explaining a example of setting the initial values to carry out the test by using the device shown in FIG. 1.
Figure 5:
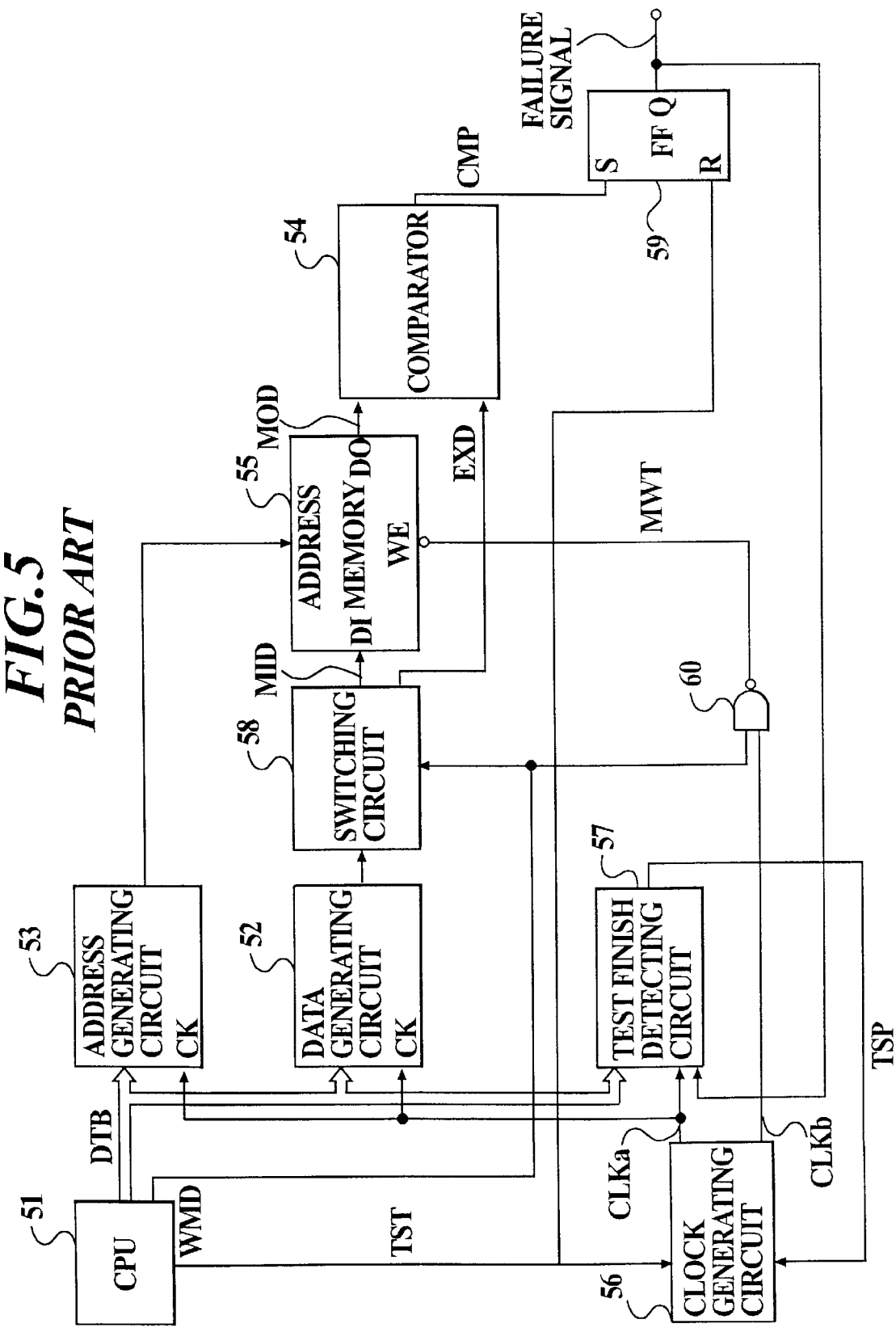
FIG. 5 is a view showing a construction of the conventional failure self-diagnosis device for semiconductor memory.

As an example of the above setting, it is assumed that each of the memory elements having an address capacity of 64 k is tested from the address "0" to "99". As shown in FIG. 4, the current value written into all of the up counters of the address generating circuits 22-1 to 22-n are set to "0", and the current value written into the down counter 31 of the first test finish detecting circuit 14 is set to 100 (=99−0+1).

The CPU 11 sets the data generating circuit 12 by outputting the test data thereto through the data bus DTB. For example, when the device checks whether the signal "0" can be written into all of the addresses to be tested or not, the CPU 11 sets the test signal to "0". On the other hand, when the device checks whether the signal "1" can be written into all of the addresses to be tested, the CPU 11 sets the test signal to "1".

As described above, the memory elements 21-1 to 21-n are obtained the start address by the address generating circuits 22-1 to 22-n, and are obtained the test data by the data generating circuit 12.

The CPU 11 designates the memory writing mode (a signal WMD is "H"). The mode signal WMD is received by the write enable circuit 15 and the comparator activating circuit 16. As a result, because the output CEN of the comparator activating circuit 16 is always "H", the comparators 23-1 to 23-n do not carry out the comparing operations.

Sequentially, the CPU 11 generates the test start signal TST in order to reset the FFs 24-1 to 24-n and in order to start the clock generating circuit 13. The clock generating circuit 13 outputs the clock signals CLKa, CLKb and CLKc repeatedly in the predetermined order.

When the clock signal CLKb is received by the write enable circuit 15, the write enable signal MWT is "L" at the time that the clock signal CLKb is "H". Then, the test data generated by the data generating circuit 12 is written into the address regions of the memory elements 21-1 to 21-n, which are assigned by the address generating circuits 22-1 to 22-n.

Further, when the clock signal CLKc is "H", the count value of the address generating circuit 22-1 to 22-n increases by 1 and the count value of the first test finish detecting circuit 14 decreases by 1.

By outputting the clock signals CLKb and CLKc from the clock generating circuit 13 repeatedly, the test data is written into the memory elements 21-1 to 21-n in sequence.

On the other hand, the down counter 31 of the first test finish detecting circuit 14 counts down the count value by synchronizing with the clock signal CLKc. When the count value of the down counter 31 is "0", the down counter 31 of the first test finish detecting circuit 14 generates the first test stop signal TSP1 to stop the clock generating circuit 13.

Therefore, the test data can be written into the address to be tested, of the memory elements 21-1 to 21-n.

After the operation in which the predetermined data are written into the memory elements 21-1 to 21-n as described above, has been finished, the operation in which the data are read out from the memory elements 21-1 to 21-n is carried out.

Next, the operation in which the data are read out from the memory elements be explained below.

Before the data are read out from the memory elements 21-1 to 21-n, the CPU 11 sets a start address of the address region to be tested by writing the current value into the up counters of the address generating circuits 22-1 to 22-n through the data bus DTB, and sets a size of the address region to be tested by writing the current value into the down counter 31 of the first test finish detecting unit 14, similarly to the operation in which the data are written into the memory elements.

The CPU 11 sets the memory reading out mode (a signal WMD is "L"). The mode signal WMD is received by the write enable circuit 15 and the comparator activating circuit 16. As a result, because the output MWT of the write enable circuit 15 is always "H", the comparators 23-1 to 23-n do not carry out the comparing operations.

Sequentially, the CPU 11 generates the test start signal TST in order to reset the FFs 24-1 to 24-n and in order to start the clock generating circuit 13. The clock generating circuit 13 outputs the clock signals CLKa, CLKb and CLKc repeatedly in the predetermined order.

When the clock signal CLKa is "H", the output CEN of the comparator activating circuit 16 is "L". As a result, the comparators 23-1 to 23-n are activated to carry out the comparing operation. In the comparing operation of the comparators 23-1 to 23-n, each of the output data of the memory elements 21-1 to 21-n is compared with the expected data outputted from the data generating circuit 12 to detect whether the two data are coincident or not. When any output data of the memory elements 21-1 to 21-n is not coincident with the expected data, the comparator corresponding to the memory element outputting the output data which is not coincident with the expected data, outputs a non-coincident result signal to set the FF corresponding thereto, and shows the detection of the failure of the memory element. Further, when any FF is set, the operation of the address generating circuit corresponding thereto is stopped. On the other hand, the other address generating circuits corresponding to the memory elements of which the failure is not detected, continues to be operated.

By outputting the clock signals CLKa and CLKc from the clock generating circuit 13 repeatedly, the test data of the memory elements 21-1 to 21-n are outputted to the comparators 23-1 to 23-n in sequence. Then, each of the output data of the memory elements 21-1 to 21-n is compared with the expected data to detect the failure of the memory elements 21-1 to 21-n.

On the other hand, the down counter 31 of the first test finish detecting circuit 14 counts down the count value by synchronizing with the clock signal CLKc. When the count value of the down counter 31 is "0", the down counter 31 of the first test finish detecting circuit 14 generates the first test stop signal TSP1 to stop the clock generating circuit 13.

Before the operation in which the data is read out from the memory elements 21-1 to 21-n is carried out, the CPU 11 sets the failure stop mode signal FSP to "H". As a result, when the failures of all of the memory elements 21-1 to 21-n are detected, the AND circuit 37 generates the second test stop signal TSP2 to stop the clock generating circuit 13.

After the above-described test was finished, a failed memory element (or a position of a failed bit) is detected by examining the outputs of the FFs 24-1 to 24-n. Further, each of the first failed addresses of the failed memory elements can be detected by examining the address generating circuits corresponding to the failed memory elements.

Although the present invention has been explained according to the embodiment, the present invention is not limited to the embodiment. Any modification may be adapted without departing from the gist thereof.

For example, in the address generating circuit, a down counter may be used instead of an up counter. In the data generating circuit, instead of outputting the fixed test data, the test data may be varied by using an up counter or a down counter in a predetermined method.

As described above, in the failure self-diagnosis device for semiconductor memory according to the present invention, because the device has a construction in which some types of resources which must be provided in accordance with the number of memory elements corresponding to the number of tester pins and must be arranged with each of the memories are incorporated into the other types of resources which can be arranged as a common unit of all the memories, in order to stop the reading out operation and the comparing operation in each memory element when the failure of the memory element occurs, the test and the examination, of the memory elements can be carried out at high speed even when the various failures occur, and the diagnosis time can be shortened.

The entire disclosure of Japanese Patent Application No. Tokugan-Hei 9-266364 filed on Sep. 30, 1997 including specification, claims drawings and summary are incorporated herein by reference in its entirety.

What is claimed is:

1. A failure self-diagnosis device for semiconductor memory, comprising:

a CPU into which a sequence program for a diagnosis is written, for controlling a diagnosis operation;

a data generating circuit for generating a test data to be written into all of memory elements when the CPU sets a memory writing mode, and for generating an expected data which is the same as a data to be precisely read out from all of the memory elements when the CPU sets a memory reading out mode;

a clock generating circuit which is started by a test start signal of the CPU, for outputting a plurality of clock signals;

a first test finish detecting unit for detecting that a test of the memory elements is finished in a predetermined region of the memory elements, and for generating a first test stop signal to stop an operation of the clock generating circuit;

address generating circuits, each of which is arranged with each of the memory elements, for generating address assigning signals to write the test data into predetermined addresses of the memory elements when the CPU sets the memory writing mode, and for generating address assigning signals to read out stored data which is written into each of the memory elements in the memory writing mode, from the predetermined addresses of the memory elements when the CPU sets the memory reading out mode;

comparators, each of which is arranged with each of the memory elements, for comparing read out data which was read out from each of the memory elements with the expected data which was outputted from the data generating circuit to generate comparison result signals;

flip flop circuits, each of which is arranged with each of the memory elements and is reset by the test start signal, and each of which is set to inactivate a corresponding address generating circuit when receiving the comparison result signal representing that the read out data from a corresponding memory element is not coincident with the expected data from the data generating circuit;

a write enable circuit for generating a write enable signal to be outputted to the memory elements, by synchronizing with a first clock signal outputted from the clock generating circuit when the CPU sets the memory writing mode; and a comparator activating circuit for generating a comparator activating signal which activates the comparators, by synchronizing with a second clock signal outputted from the clock generating circuit when the CPU sets the memory reading out mode.

2. A failure self-diagnosis device for semiconductor memory, as claimed in claim 1; wherein each of the address generating circuits comprises an up counter.

3. A failure self-diagnosis device for semiconductor memory, as claimed in claim 1; wherein the test finish detecting unit comprises a down counter.

4. A failure self-diagnosis device for semiconductor memory, as claimed in claim 1; further comprising a second test finish detecting unit for generating a second test stop signal to stop the operation of the clock generating circuit when the second test finish detecting unit inputs output signals of all of the flip flop circuits and all of the flip flop circuits are set.

5. A failure self-diagnosis device for semiconductor memory, comprising:

a CPU for controlling a diagnosis operation;

a data generating circuit for generating a test data to be written into memory elements to be diagnosed and an expected data which is the same as a data to be precisely read out from the memory elements after the test data was precisely written into the memory elements;

a clock generating circuit for outputting a clock signal;

address generating circuits, each of which is arranged with each of the memory elements to be diagnosed, for generating address assigning signals by synchronizing with the clock signal;

comparators, each of which is arranged with each of the memory elements to be diagnosed, for comparing read out data which was read out from each of the memory elements by synchronizing with the address assigning signal, with the expected data; and diagnosis stop circuits, each of which is arranged with each of the memory elements to be diagnosed, for stopping the diagnosis operation of each of the memory elements when a corresponding comparator judges that the read out data from a corresponding memory element is not coincident with the expected data.

* * * * *